United States Patent
Ang et al.

(10) Patent No.: US 6,468,851 B1
(45) Date of Patent: Oct. 22, 2002

(54) METHOD OF FABRICATING CMOS DEVICE WITH DUAL GATE ELECTRODE

(75) Inventors: Chew-Hoe Ang, Singapore (SG); Eng-Hua Lim, S'Por (SG); Randall Cher Liang Cha, Singapore (SG); Jia-Zhen Zheng, Singapore (SG); Elgin Kiok Boone Quek, Singapore (SG); Mei-Sheng Zhou, Singapore (SG); Daniel Lee-Wei Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/038,886

(22) Filed: Jan. 2, 2002

(51) Int. Cl.$^7$ .......................................... H01L 21/8238
(52) U.S. Cl. ...................................... 438/216; 438/231
(58) Field of Search ................................. 438/216, 224, 438/228, 231, 232

(56) References Cited

U.S. PATENT DOCUMENTS

| | | | |
|---|---|---|---|
| 5,750,428 A | 5/1998 | Chang | 438/264 |
| 5,918,116 A | 6/1999 | Chittipeddi | 438/199 |
| 6,033,943 A | 3/2000 | Gardner | 438/199 |
| 6,043,157 A | 3/2000 | Gardner et al. | 438/692 |
| 6,130,123 A * | 10/2000 | Liang et al. | 438/218 |
| 6,159,782 A | 12/2000 | Xiang et al. | 438/197 |
| 6,171,911 B1 | 1/2001 | Yu | 438/275 |
| 6,333,244 B1 * | 12/2001 | Yu | 438/231 |
| 6,387,743 B1 * | 5/2002 | Shiozawa et al. | 438/199 |

\* cited by examiner

Primary Examiner—Chandra Chaudhari
(74) Attorney, Agent, or Firm—George O. Saile; Rosemary L. S. Pike; Stephen G. Stanton (57) ABSTRACT

A method of fabricating a dual gate electrode CMOS device having dual gate electrodes. An N+ poly gate is used for the nMOSFET and a metal gate is used for the pMOSFET. The N+ nMOSFET poly gate may be capped with a highly conductive metal to reduce its gate resistance. A sacrificial cap is used for the N+ poly gate to eliminate a mask level for the dual gate electrodes.

39 Claims, 5 Drawing Sheets

METHOD OF FABRICATING CMOS DEVICE WITH DUAL GATE ELECTRODE

The present invention relates generally to fabrication of semiconductor devices, and more specifically to methods of fabricating dual gate complimentary metal-oxide semiconductor (CMOS) devices.

BACKGROUND OF THE INVENTION

The conventional dual poly-gate CMOS process includes the following problems:
1) diffusion of the p+ poly gate deposit dopant (boron) through very thin oxide; and
2) gate depletion effect due to insufficient dopant activation in a low thermal-budget process with the gate depletion resulting in drive current degradation.

In attempts to overcome these problems associated with dual poly-gate CMOS processes, various dual-metal gate CMOS processes having two different metal materials for n-MOSFET (n-channel metal-oxide semiconductor field effect transistor) and p-MOSFET (p-channel metal-oxide semiconductor field effect transistor) (to achieve different work functions), respectively, have been proposed in the past. However, in general the dual-metal gate CMOS processes are very complicated and require many masking levels.

For example, U.S. Pat. No. 6,159,782 to Xiang et al. describes a method for fabricating short channel field effect transistors (N-channel MOSFET and P-channel MOSFET) with dual gates and with a gate dielectric having a high dielectric constant.

U.S. Pat. No. 6,043,157 to Gardner et al. describes a dual replacement gate process.

U.S. Pat. No. 6,033,943 to Gardner describes a semiconductor manufacturing process for producing MOS integrated circuits having two gate oxide thicknesses.

U.S. Pat. No. 6,171,911 to Yu describes a method for forming dual gate oxides on integrated circuits with advanced logic devices.

U.S. Pat. No. 5,918,116 to Chittipeddi describes a process for forming gate oxides possessing different thicknesses on a semiconductor substrate.

U.S. Pat. No. 5,750,428 to Chang describes a self-aligned non-volatile process with differentially grown gate oxide thicknesses to fabricate an electrically erasable programmable read only memory (EEPROM).

SUMMARY OF THE INVENTION

Accordingly, it is an object of the present invention to provide an improved method of fabricating a dual-gate CMOS device.

Another object of the present invention to provide an improved method of fabricating a dual-gate CMOS device having n+ poly/metal gate for an n-MOSFET and a metal gate for a p-MOSFET.

Other objects will appear hereinafter.

It has now been discovered that the above and other objects of the present invention may be accomplished in the following manner. Specifically, a wafer is provided having an N-MOSFET region and a P-MOSFET region. A sacrificial gate layer/doped N+ poly-1 layer/gate insulator layer stack is formed over the wafer. The N-MOSFET sacrificial gate layer is patterned to form a once patterned sacrificial gate layer only within the N-MOSFET region, exposing the doped N+ poly-1 layer within the P-MOSFET region. An undoped poly-2 layer is formed over the once patterned sacrificial gate layer and the exposed N+ poly-1 layer within the P-MOSFET region. The undoped poly-2 layer is planarized to form a planarized undoped poly-2 layer only within the P-MOSFET region. The once patterned sacrificial gate layer, the doped N+ poly-1 layer and the gate insulator layer within the N-MOSFET region are planarized to form an initial N-MOSFET gate electrode stack having exposed sidewalls. The planarized undoped poly-2 layer, the doped N+ poly-1 layer and the gate insulator layer within the P-MOSFET region are planarized to form an initial P-MOSFET gate electrode stack having exposed sidewalls. Sidewall spacers are formed adjacent the exposed sidewalls of the initial N-MOSFET and P-MOSFET gate electrode stacks. An intermetal dielectric layer is formed adjacent and between the initial N-MOSFET and P-MOSFET gate electrode stacks. The initial P-MOSFET gate electrode stack is removed to form a P-MOSFET gate cavity exposing a portion of the wafer. A second P-MOSFET gate insulator layer is formed within the P-MOSFET gate cavity over the exposed portion of the wafer. The upper sacrificial gate layer of the initial N-MOSFET gate electrode stack is removed to form an N-MOSFET gate cavity. A metal layer is formed over the structure, filling the remaining P-MOSFET gate cavity and the N-MOSFET gate cavity. The metal layer is planarized to remove the excess metal from over the intermetal dielectric layer leaving planarized N-MOSFET metal gate electrode cap within N-MOSFET gate cavity to form a finalized N-MOSFET and planarized P-MOSFET metal gate within the remaining P-MOSFET gate cavity to form a finalized P-MOSFET, thus completing formation of the dual gate electrode CMOS device.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Initial Structure

Figure 1:
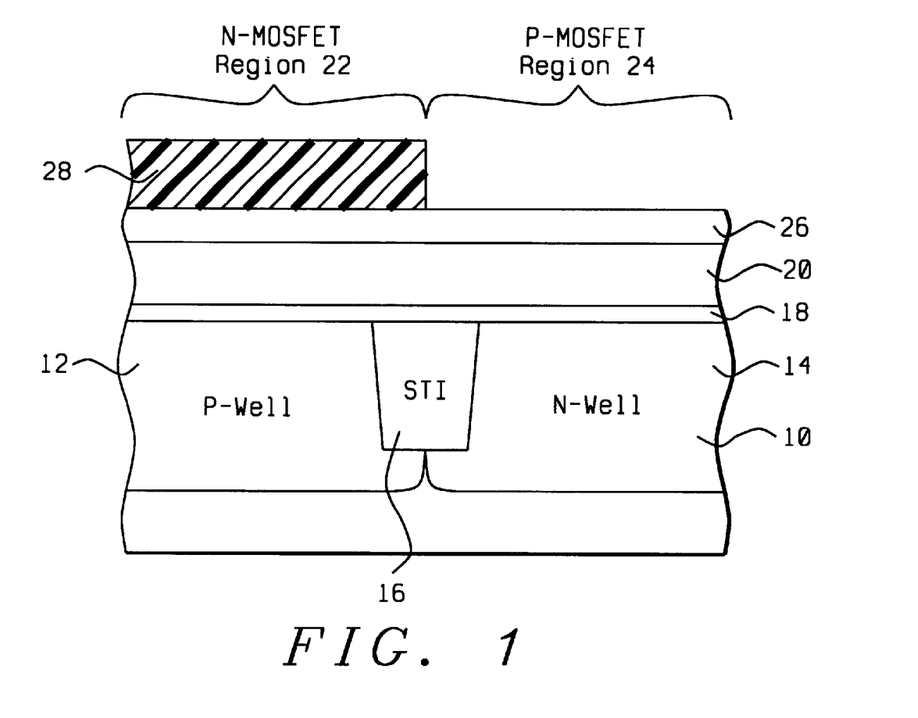
FIGS. 1 to 9 schematically illustrate in cross-sectional representation a preferred embodiment of the present invention.

FIG. 1 illustrates a cross-sectional view of a wafer 10, preferably a semiconductor wafer, after twin-well 12, 14 (P-well 12 and N-well 14) and shallow trench isolation (STI) 16 formation. Formed over wafer 10, is gate insulator layer 18 that is preferably comprised of $SiO_2$ (silicon oxide or oxide) grown by a conventional oxidation process or a high-k dielectric material such as $HfO_2$. Gate insulator layer 18 is preferably from about 10 to 200 Å thick.

Formed over gate insulator layer 18 is first N+ polysilicon (N+ poly-1) layer 20. N+ poly-1 layer 20 has a thickness of preferably from about 1500 to 2500 Å and is preferably deposited by low-pressure chemical vapor deposition (LPCVD) at preferably from about 620 to 650° C. N+ poly-1 layer 20 is preferably doped either in-situ using $POCl_3$ during poly deposition or post-poly deposition phosphor/arsenic implantation.

Formed over N+ poly-1 layer 20 is upper N-MOSFET sacrificial gate layer 26 that is preferably formed of silicon nitride ($Si_3N_4$) or nitride. Nitride layer 26 is preferably from about 500 to 1000 Å thick and is preferably deposited by LPCVD.

Wafer 10 also includes N-MOSFET/P-well region 22 and P-MOSFET/N-well region 24.

Nitride layer 26 is exposed at least within P-MOSFET/N-well region 24, i.e. nitride layer 26 is covered or masked within N-MOSFET/P-well region 22, by, for example, conventional lithography. For example patterned photoresist layer 28 is formed at least over N-MOSFET/P-well region 22 leaving at least the portion of nitride layer 26 within P-MOSFET/N-well region 24 exposed.

Patterning Nitride Layer 26/Depositing Second Undoped Poly Layer 30

Figure 2:
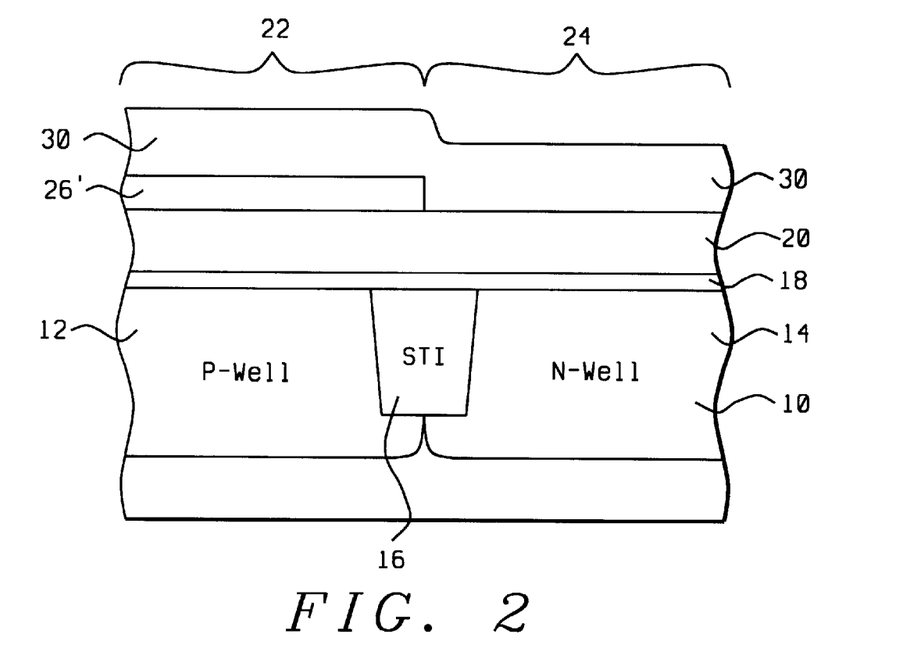

As shown in FIG. 2, the exposed portion of nitride layer 26 within P-MOSFET/N-well region 24 is then removed, preferably by a wet etch preferably using hot phosphoric acid, leaving patterned nitride layer 26' within at least the N-MOSFET/P-well region 22 and exposing $N^+$ poly-1 layer 20 within P-MOSFET/N-well region 24. Patterned photoresist layer 28 is then stripped from the structure.

It is noted that nitride layer 26 may be patterned by other methods to remove at least the portion of nitride layer 26 within P-MOSFET/N-well region 24 leaving patterned nitride layer 26' within at least the N-MOSFET/P-well region 22 and exposing $N^+$ poly-1 layer 20 within P-MOSFET/N-well region 24.

Second undoped polysilicon (poly-2) layer 30 is then deposited over the structure, covering patterned nitride layer 26' and the exposed portion of $N^+$ poly-1 layer 20 within P-MOSFET/N-well region 24. Poly-2 layer 30 is preferably deposited by LPCVD at from about 600 to 650° C.

Planarization of Poly-2 Layer 30

Figure 3:
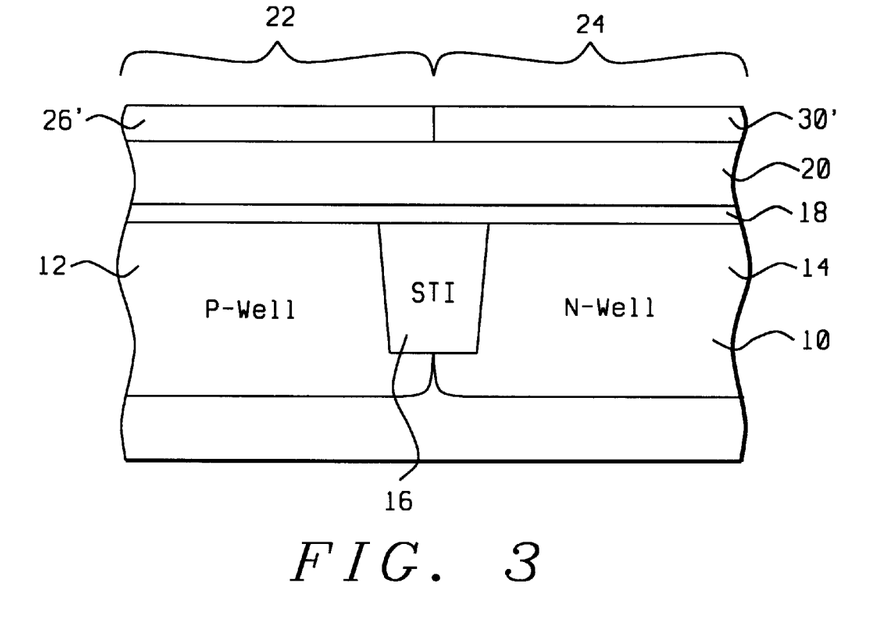

As shown in FIG. 3, poly-2 layer 30 is then planarized, preferably by chemical mechanical polishing (CMP), using patterned nitride layer 26' as a polish stop layer, leaving planarized poly-2 portion 30'.

Patterning of Initial N-MOSFET and P-MOSFET Gate Electrode Stacks 34, 36

Figure 4:
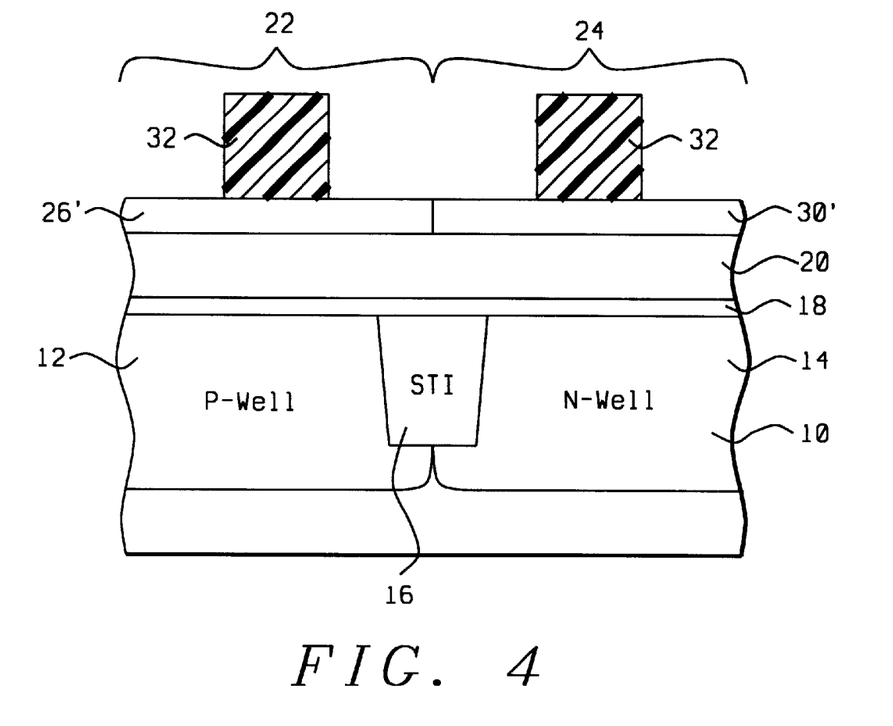
Figure 5:
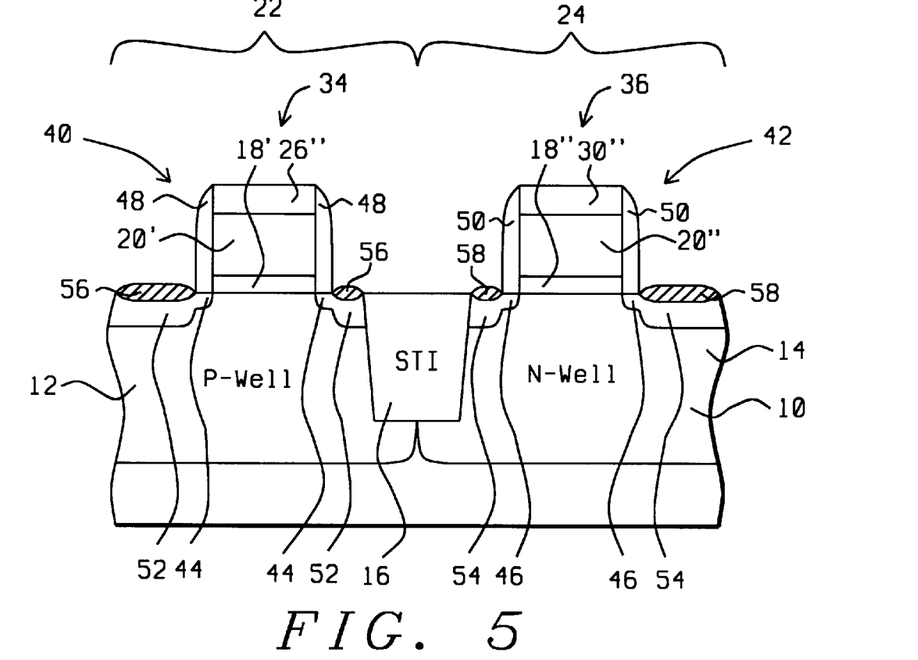

As shown in FIGS. 4 and 5, initial N-MOSFET and P-MOSFET gate electrode stacks 34, 36 are patterned. For example, as shown in FIG. 4, initial N-MOSFET and P-MOSFET gate electrode stacks 34, 36 may be patterned by forming patterned photoresist portions 32 over patterned nitride layer 26' within N-MOSFET/P-well region 22 and over planarized poly-2 portion 30' within P-MOSFET/N-well region 24, respectively, and then etching the respective underlying exposed layers down to wafer 10 within N-MOSFET/P-well region 22 and P-MOSFET/N-well region 24. The initial gate electrode stack 34, 36 etching preferably consists of an SiN etch following by a poly etch.

It is noted that the respective underlying layers down to wafer 10 within N-MOSFET/P-well region 22 and P-MOSFET/N-well region 24 may be patterned by other methods to form initial N-MOSFET and P-MOSFET gate electrode stacks 34, 36, respectively. Initial N-MOSFET gate electrode stack 34 comprises patterned nitride layer (dummy nitride layer or sacrificial nitride cap) 26"/patterned $N^+$ poly-1 layer 20'/patterned gate insulator layer 18'; and initial P-MOSFET gate electrode stack/dummy P-MOSFET gate electrode stack 36 comprises patterned undoped poly-2 layer 30"/patterned $N^+$ poly-1 layer 20"/patterned gate insulator layer 18".

Forming Implants 44, 46; 52, 54/Sidewall Spacers 48, 50/Silicide Portions 56, 58

As shown in FIG. 5, N-MOSFET 40 and P-MOSFET 42 are completed using: conventional LDD implants 44, 46, respectively; sidewall spacer 48, 50 formation, respectively; and S/D implants 52, 54, respectively; and silicidation to form silicide portions 56, 58, respectively.

Formation of Intermetal Dielectric Layer 60

Figure 6:
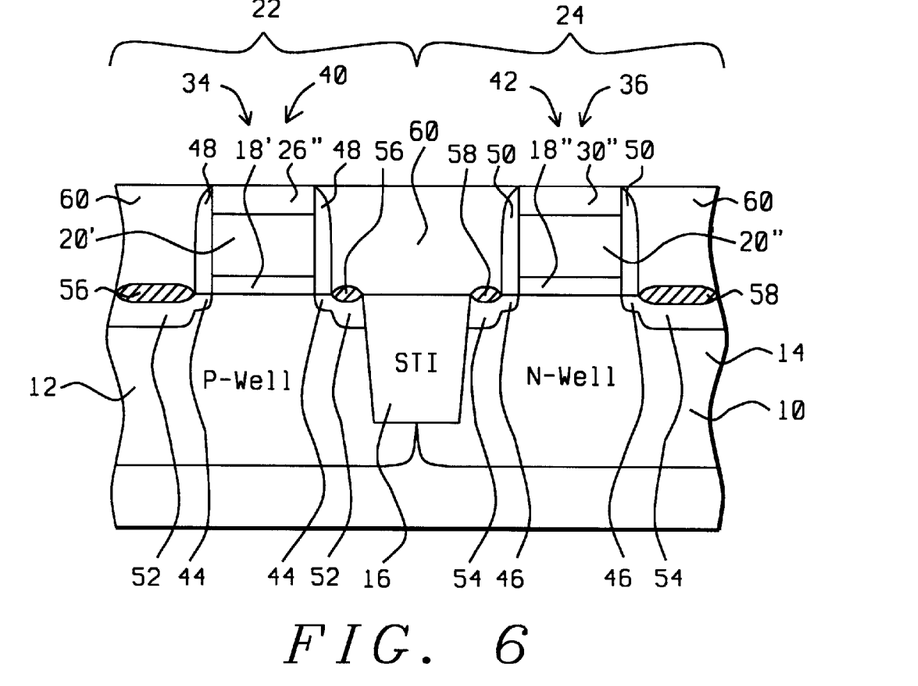

As shown in FIG. 6, an intermetal dielectric (IMD) layer 60 is formed over the structure and adjacent initial N-MOSFET gate electrode stack 34 and initial P-MOSFET gate electrode stack 36 and IMD layer 60 is planarized as shown in FIG. 6 to expose patterned undoped poly-2 layer 30" (or dummy poly-2 portion 30"). IMD layer 60 is preferably comprised of silicon oxide ($SiO_2$) (oxide) and is initially deposited to a thickness of preferably from about 8000 to 15,000 Å using preferably a plasma enhanced CVD (PECVD) process at a temperature of from about 400 to 450° C. Interlayer oxide layer 60 is preferably planarized by an oxide CMP process to expose dummy poly portion 30" at the P-MOSFET/N-well region 24.

Removal of Initial/Dummy P-MOSFET Gate Electrode Stack 36 and Formation of Gate Insulator Layer 62

Figure 7:
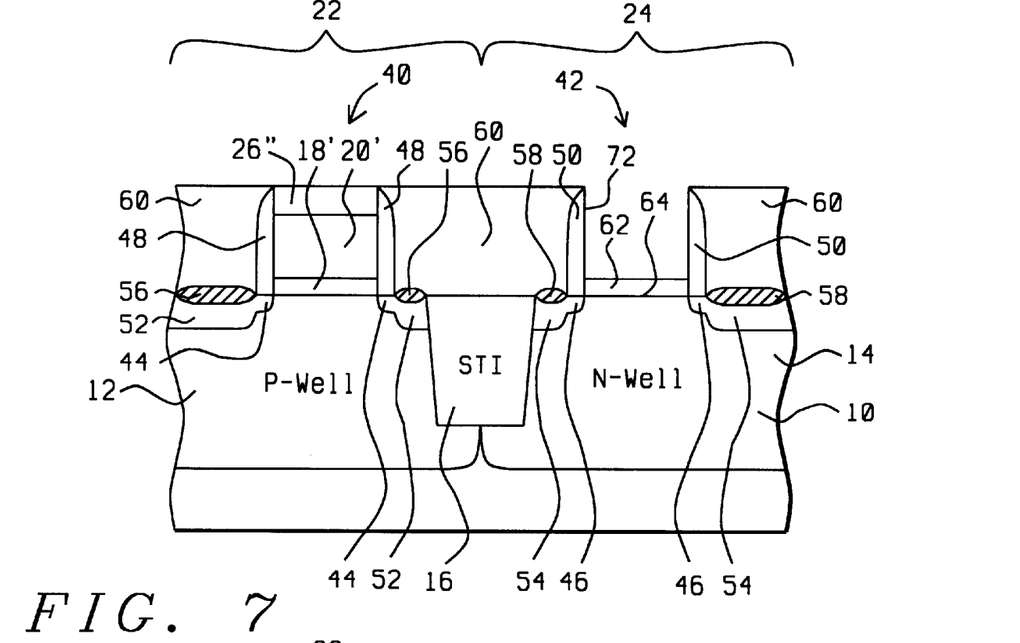

As shown in FIG. 7, initial/dummy P-MOSFET gate electrode stack 36 (patterned undoped poly-2 layer 30"/patterned $N^+$ poly-1 layer 20"/patterned gate insulator layer 18") is removed, preferably using a dry etch process, to expose a portion 64 of wafer 10.

Second P-MOSFET gate insulator layer 62 is then formed over portion 64 of wafer 10 to a thickness of preferably from about 10 to 200 Å leaving P-MOSFET gate cavity 72 over second P-MOSFET gate insulator layer 62 and between P-MOSFET sidewall spacers 50. Second P-MOSFET gate insulator layer 62 is preferably formed of oxide.

Dummy N-MOSFET nitride layer 26' prevents oxidation on patterned $N^+$ poly-1 layer 20' during formation of second P-MOSFET gate insulator layer 62.

Removal of Dummy N MOSFET Nitride Layer 26'

Figure 8:
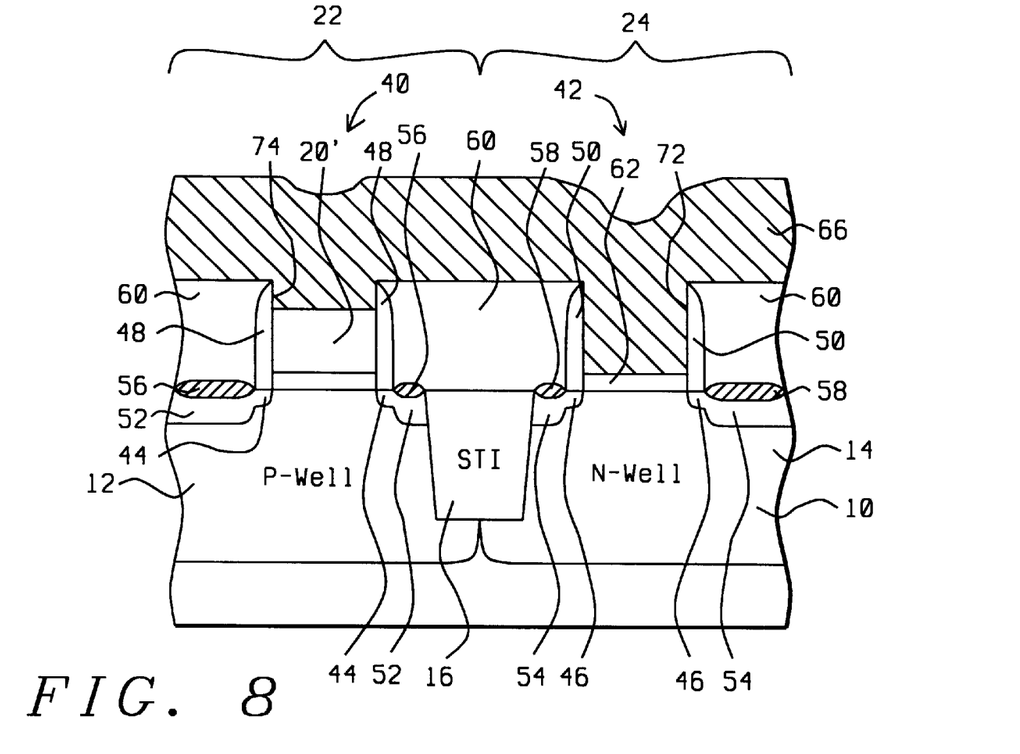

As shown in FIG. 8, dummy N-MOSFET nitride layer 26" is then removed from initial N-MOSFET gate electrode stack 34, preferably by a wet etch process, leaving N-MOSFET gate cavity 74 over patterned $N^+$ poly-1 layer 20' and between N-MOSFET sidewall spacers 48. Dummy N-MOSFET nitride layer 26" is preferably stripped using hot phosphoric acid followed by an optional short (from about 10 to 20 seconds) and diluted (about 200:1) HF dip to remove any top damaged upper surface of second P-MOSFET gate insulator layer 62.

Deposition of Metal Layer 66

As shown in FIG. 8, a highly conductive metal layer 66 is deposited over the structure, filling P-MOSFET gate cavity 72 and N-MOSFET gate cavity 74. Metal layer 66 is preferably comprised of copper, aluminum, titanium nitride (TiN) or tungsten (W) and is more preferably comprised of copper.

Planarization of Metal Layer 66

Figure 9:
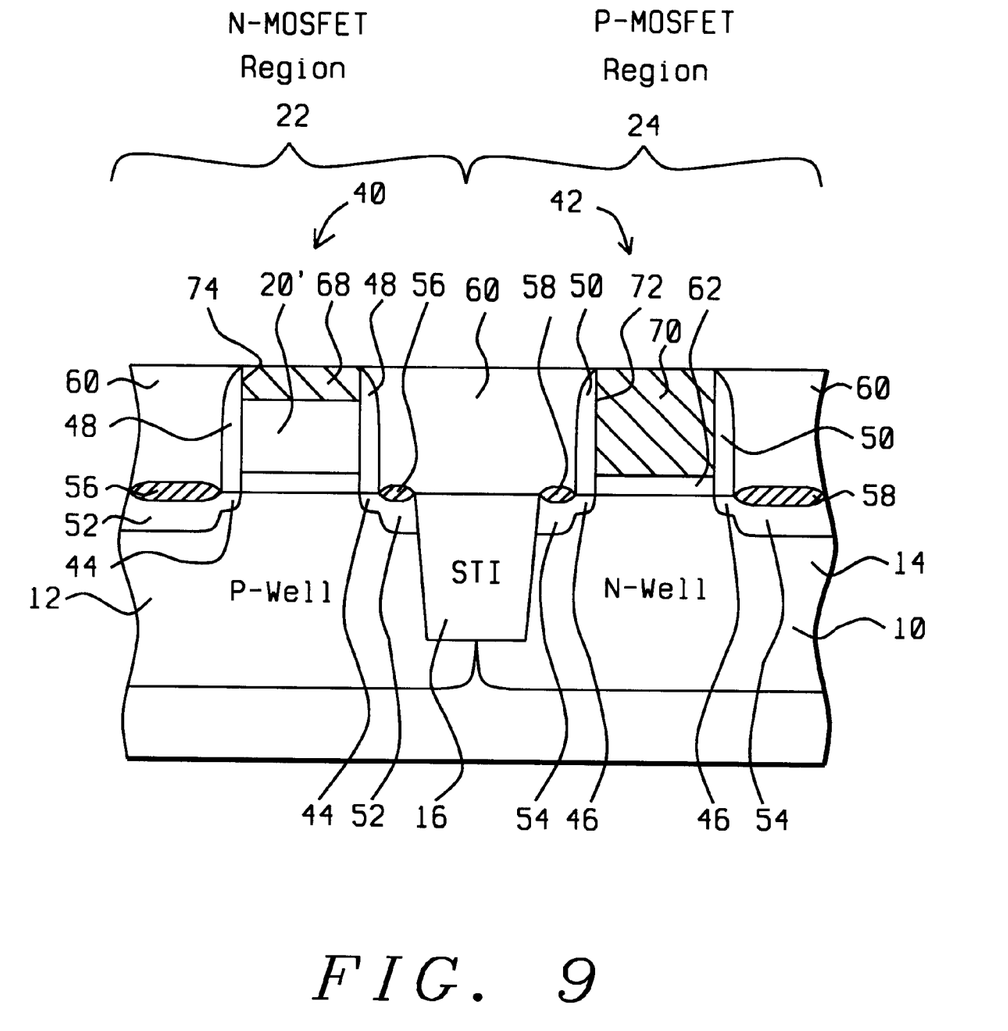

As shown in FIG. 9, metal layer 66 is planarized to remove the excess metal from over IMD layer 60, leaving planarized N-MOSFET metal gate electrode cap 68 (within N-MOSFET gate cavity 74) over $n^+$ poly-1 gate 20' and planarized P-MOSFET metal gate 70 (within P-MOSFET gate cavity 72).

This completes formation of finalized N-MOSFET 40 and finalized P-MOSFET 42.

Advantages of One or More Embodiments of the Invention

The advantages of one or more embodiments of the dual-gate CMOS device fabrication method of the present invention include:

1) boron penetration and poly depletion concerns in P-MOSFET devices 42 are eliminated by a fairly simple method;

2) the gate resistance for N-MOSFET devices 40 are reduced through the use of a highly conductive metal gate electrode cap 68 over the N-MOSFET n⁺ poly-1 gate 20' in a fairly simple method; and 3) a sacrificial nitride cap 26" is employed over the initial N-MOSFET gate electrode stack 34 to eliminate one mask level for the dual-gate CMOS device.

While particular embodiments of the present invention have been illustrated and described, it is not intended to limit the invention, except as defined by the following claims.

We claim:

1. A method of fabricating a dual gate electrode CMOS device, comprising the steps of:

providing a wafer having an N-MOSFET region and a P-MOSFET region;

forming a sacrificial gate layer/doped N⁺ poly-1 layer/gate insulator layer stack over the wafer;

patterning the N-MOSFET sacrificial gate layer to form a once patterned sacrificial gate layer only within the N-MOSFET region, exposing the doped N⁺ poly-1 layer within the P-MOSFET region;

forming an undoped poly-2 layer over the once patterned sacrificial gate layer and the exposed N⁺ poly-1 layer within the P-MOSFET region;

planarizing the undoped poly-2 layer to form a planarized undoped poly-2 layer only within the P-MOSFET region;

patterning:

the once patterned sacrificial gate layer, the doped N⁺ poly-1 layer and the gate insulator layer within the N-MOSFET region to form an initial N-MOSFET gate electrode stack having exposed sidewalls; and the planarized undoped poly-2 layer, the doped N⁺ poly-1 layer and the gate insulator layer within the P-MOSFET region to form an initial P-MOSFET gate electrode stack having exposed sidewalls;

forming sidewall spacers adjacent the exposed sidewalls of the initial N-MOSFET and P-MOSFET gate electrode stacks;

forming an intermetal dielectric layer adjacent and between the initial N-MOSFET and P-MOSFET gate electrode stacks;

removing the initial P-MOSFET gate electrode stack to form a P-MOSFET gate cavity exposing a portion of the wafer;

forming a second P-MOSFET gate insulator layer within the P-MOSFET gate cavity over the exposed portion of the wafer;

removing the upper sacrificial gate layer of the initial N-MOSFET gate electrode stack to form an N-MOSFET gate cavity;

forming a metal layer over the structure, filling the remaining P-MOSFET gate cavity and the N-MOSFET gate cavity; and planarizing the metal layer to remove the excess metal from over the intermetal dielectric layer leaving planarized N-MOSFET metal gate electrode cap within N-MOSFET gate cavity to form a finalized N-MOSFET and planarized P-MOSFET metal gate within the remaining P-MOSFET gate cavity to form a finalized P-MOSFET, thus completing formation of the dual gate electrode CMOS device.

2. The method of claim 1, wherein the sacrificial gate layer is formed of a material selected from the group consisting of silicon nitride and nitride; and the gate insulator layer is formed of a material selected from the group consisting of silicon oxide or a high-k dielectric material.

3. The method of claim 1, wherein the sacrificial gate layer is formed of nitride, and the gate insulator layer is $HfO_2$.

4. The method of claim 1, wherein the sacrificial gate layer is from about 500 to 1000 Å thick, the N⁺ poly-1 layer is from about 1500 to 2500 Å thick, and the gate insulator layer is from about 10 to 200 Å thick.

5. The method of claim 1, wherein the undoped poly-2 layer is formed by an LPCVD deposition at a temperature of from about 600 to 650° C.

6. The method of claim 1, wherein the undoped poly-2 layer is planarized by chemical mechanical polishing.

7. The method of claim 1, including the steps of:

forming respective conventional LDD implants within the wafer adjacent the initial N-MOSFET and P-MOSFET gate electrode stacks before formation of sidewall spacers;

forming respective S/D implants adjacent the respective LDD implants after formation of sidewall spacers; and forming respective silicide portions on the wafer over the respective S/D implants.

8. The method of claim 1, wherein the intermetal dielectric layer is comprised of silicon oxide.

9. The method of claim 1, wherein the intermetal dielectric layer is comprised of silicon oxide and is formed by a PECVD process at a temperature of from about 400 to 450° C.

10. The method of claim 1, wherein the initial P-MOSFET gate electrode stack is removed by a dry etch process and the upper sacrificial gate layer of the initial N-MOSFET gate electrode stack is removed by wet etch process.

11. The method of claim 1, wherein the second P-MOSFET gate insulator layer has a thickness of from about 10 to 200 Å.

12. The method of claim 1, wherein the second P-MOSFET gate insulator layer is oxide.

13. The method of claim 1, wherein the metal layer is comprised of a material selected from the group consisting of copper, aluminum, titanium nitride and tungsten.

14. The method of claim 1, wherein the metal layer is copper.

15. A method of fabricating a dual gate electrode CMOS device, comprising the steps of:

providing a wafer having an N-MOSFET region and a P-MOSFET region;

forming a sacrificial gate layer/doped N⁺ poly-1 layer/gate insulator layer stack over the wafer;

patterning the N-MOSFET sacrificial gate layer to form a once patterned sacrificial gate layer only within the N-MOSFET region, exposing the doped N⁺ poly-1 layer within the P-MOSFET region;

forming an undoped poly-2 layer over the once patterned sacrificial gate layer and the exposed N⁺ poly-1 layer within the P-MOSFET region;

planarizing the undoped poly-2 layer to form a planarized undoped poly-2 layer only within the P-MOSFET region;

patterning:

the once patterned sacrificial gate layer, the doped N⁺ poly-1 layer and the gate insulator layer within the N-MOSFET region to form an initial N-MOSFET gate electrode stack having exposed sidewalls; and the planarized undoped poly-2 layer, the doped N⁺ poly-1 layer and the gate insulator layer within the P-MOSFET region to form an initial P-MOSFET gate electrode stack having exposed sidewalls;

forming respective conventional LDD implants within the wafer adjacent the initial N-MOSFET and P-MOSFET gate electrode stacks;

forming sidewall spacers adjacent the exposed sidewalls of the initial N-MOSFET and P-MOSFET gate electrode stacks;

forming respective S/D implants adjacent the respective LDD implants;

forming respective silicide portions on the wafer over the respective S/D implants;

forming an intermetal dielectric layer adjacent and between the initial N-MOSFET and P-MOSFET gate electrode stacks;

removing the initial P-MOSFET gate electrode stack to form a P-MOSFET gate cavity exposing a portion of the wafer;

forming a second P-MOSFET gate insulator layer within the P-MOSFET gate cavity over the exposed portion of the wafer;

removing the upper sacrificial gate layer of the initial N-MOSFET gate electrode stack to form an N-MOSFET gate cavity;

forming a metal layer over the structure, filling the remaining P-MOSFET gate cavity and the N-MOSFET gate cavity; and planarizing the metal layer to remove the excess metal from over the intermetal dielectric layer leaving planarized N-MOSFET metal gate electrode cap within N-MOSFET gate cavity to form a finalized N-MOSFET and planarized P-MOSFET metal gate within the remaining P-MOSFET gate cavity to form a finalized P-MOSFET, thus completing formation of the dual gate electrode CMOS device.

16. The method of claim 15, wherein the sacrificial gate layer is formed of a material selected from the group consisting of silicon nitride and nitride; and the gate insulator layer is formed of a material selected from the group consisting of silicon oxide or a high-k dielectric material.

17. The method of claim 15, wherein the sacrificial gate layer is formed of nitride, and the gate insulator layer is $HfO_2$.

18. The method of claim 15, wherein the sacrificial gate layer is from about 500 to 1000 Å thick, the $N^+$ poly-1 layer is from about 1500 to 2500 Å thick, and the gate insulator layer is from about 10 to 200 Å thick.

19. The method of claim 15, wherein the undoped poly-2 layer is formed by an LPCVD deposition at a temperature of from about 600 to 650° C.

20. The method of claim 15, wherein the undoped poly-2 layer is planarized by chemical mechanical polishing.

21. The method of claim 15, wherein the intermetal dielectric layer is comprised of silicon oxide.

22. The method of claim 15, wherein the intermetal dielectric layer is comprised of silicon oxide and is formed by a PECVD process at a temperature of from about 400 to 450° C.

23. The method of claim 15, wherein the initial P-MOSFET gate electrode stack is removed by a dry etch process and the upper sacrificial gate layer of the initial N-MOSFET gate electrode stack is removed by wet etch process.

24. The method of claim 15, wherein the second P-MOSFET gate insulator layer has a thickness of from about 10 to 200 Å.

25. The method of claim 15, wherein the second P-MOSFET gate insulator layer is oxide.

26. The method of claim 15, wherein the metal layer is comprised of a material selected from the group consisting of copper, aluminum, titanium nitride and tungsten.

27. The method of claim 15, wherein the metal layer is copper.

28. A method of fabricating a dual gate electrode CMOS device, comprising the steps of:

providing a wafer having an N-MOSFET region and a P-MOSFET region;

forming a sacrificial gate layer/doped $N^+$ poly-1 layer/gate insulator layer stack over the wafer; the sacrificial gate layer being formed of a material selected from the group consisting of silicon nitride and nitride; the gate insulator layer is formed of a material selected from the group consisting of silicon oxide or a high-k dielectric material;

patterning the N-MOSFET sacrificial gate layer to form a once patterned sacrificial gate layer only within the N-MOSFET region, exposing the doped $N^+$ poly-1 layer within the P-MOSFET region;

forming an undoped poly-2 layer over the once patterned sacrificial gate layer and the exposed $N^+$ poly-1 layer within the P-MOSFET region;

planarizing the undoped poly-2 layer to form a planarized undoped poly-2 layer only within the P-MOSFET region;

patterning:
the once patterned sacrificial gate layer, the doped $N^+$ poly-1 layer and the gate insulator layer within the N-MOSFET region to form an initial N-MOSFET gate electrode stack having exposed sidewalls; and
the planarized undoped poly-2 layer, the doped $N^+$ poly-1 layer and the gate insulator layer within the P-MOSFET region to form an initial P-MOSFET gate electrode stack having exposed sidewalls;

forming respective conventional LDD implants within the wafer adjacent the initial N-MOSFET and P-MOSFET gate electrode stacks;

forming sidewall spacers adjacent the exposed sidewalls of the initial N-MOSFET and P-MOSFET gate electrode stacks;

forming respective S/D implants adjacent the respective LDD implants;

forming respective silicide portions on the wafer over the respective S/D implants;

forming an intermetal dielectric layer adjacent and between the initial N-MOSFET and P-MOSFET gate electrode stacks;

removing the initial P-MOSFET gate electrode stack to form a P-MOSFET gate cavity exposing a portion of the wafer;

forming a second P-MOSFET gate insulator layer within the P-MOSFET gate cavity over the exposed portion of the wafer;

removing the upper sacrificial gate layer of the initial N-MOSFET gate electrode stack to form an N-MOSFET gate cavity;

forming a metal layer over the structure, filling the remaining P-MOSFET gate cavity and the N-MOSFET gate cavity; and planarizing the metal layer to remove the excess metal from over the intermetal dielectric layer leaving planarized N-MOSFET metal gate electrode cap within N-MOSFET gate cavity to form a finalized N-MOSFET and planarized P-MOSFET metal gate within the remaining P-MOSFET gate cavity to form a finalized P-MOSFET, thus completing formation of the dual gate electrode CMOS device.

29. The method of claim 28, wherein the sacrificial gate layer is formed of nitride, and the gate insulator layer is $HfO_2$.

30. The method of claim 28, wherein the sacrificial gate layer is from about 500 to 1000 Å thick, the $N^+$ poly-1 layer is from about 1500 to 2500 Å thick, and the gate insulator layer is from about 10 to 200 Å thick.

31. The method of claim 28, wherein the undoped poly-2 layer is formed by an LPCVD deposition at a temperature of from about 600 to 650° C.

32. The method of claim 28, wherein the undoped poly-2 layer is planarized by chemical mechanical polishing.

33. The method of claim 28, wherein the intermetal dielectric layer is comprised of silicon oxide.

34. The method of claim 28, wherein the intermetal dielectric layer is comprised of silicon oxide and is formed by a PECVD process at a temperature of from about 400 to 450° C.

35. The method of claim 28, wherein the initial P-MOSFET gate electrode stack is removed by a dry etch process and the upper sacrificial gate layer of the initial N-MOSFET gate electrode stack is removed by wet etch process.

36. The method of claim 28, wherein the second P-MOSFET gate insulator layer has a thickness of from about 10 to 200 Å.

37. The method of claim 28, wherein the second P-MOSFET gate insulator layer is oxide.

38. The method of claim 28, wherein the metal layer is comprised of a material selected from the group consisting of copper, aluminum, titanium nitride and tungsten.

39. The method of claim 28, wherein the metal layer is copper.

* * * * *

UNITED STATES PATENT AND TRADEMARK OFFICE
CERTIFICATE OF CORRECTION

PATENT NO. : 6,468,851 B1
DATED : October 22, 2002
INVENTOR(S) : Chew-Hoe Ang et al.

It is certified that error appears in the above-identified patent and that said Letters Patent is hereby corrected as shown below:

<u>Title page,</u>
Item [75], delete "Eng-Hua Lim, S'Por (SG)", and replace with
-- Eng-Hua Lim, Singapore (SG) --.

Signed and Sealed this

Eighteenth Day of March, 2003

JAMES E. ROGAN
*Director of the United States Patent and Trademark Office*